United States Patent
Graf et al.

(10) Patent No.: US 9,735,019 B2
(45) Date of Patent: Aug. 15, 2017

(54) PROCESS GAS ENHANCEMENT FOR BEAM TREATMENT OF A SUBSTRATE

(71) Applicant: TEL Epion Inc., Billerica, MA (US)

(72) Inventors: Michael Graf, Belmont, MA (US); Noel Russell, Waterford, NY (US); Matthew C. Gwinn, Winchendon, MA (US); Allen J. Leith, Brookline, NH (US)

(73) Assignee: TEL Epion Inc., Billerica, MA (US)

(*) Notice: Subject to any disclaimer, the term of this patent is extended or adjusted under 35 U.S.C. 154(b) by 0 days.

(21) Appl. No.: 14/842,416

(22) Filed: Sep. 1, 2015

(65) Prior Publication Data
US 2016/0071734 A1   Mar. 10, 2016

Related U.S. Application Data

(60) Provisional application No. 62/046,878, filed on Sep. 5, 2014.

(51) Int. Cl.
*H01L 21/3065* (2006.01)
*H01L 27/02* (2006.01)
(Continued)

(52) U.S. Cl.
CPC ........ *H01L 21/3065* (2013.01); *H01J 27/026* (2013.01); *H01J 37/317* (2013.01);
(Continued)

(58) Field of Classification Search
None
See application file for complete search history.

(56) References Cited

U.S. PATENT DOCUMENTS 6,135,128 A   10/2000   Graf et al.
7,629,590 B2  12/2009   Horsky et al.
(Continued)

FOREIGN PATENT DOCUMENTS

JP   11-330033    11/1999
JP   5493139 B1   5/2014
(Continued)

OTHER PUBLICATIONS

Taiwan Intellectual Property Office, Notice of Examination Opinion issued in corresponding TW Application No. 104129088 on Aug. 16, 2016, 27 pp. including English translation.
(Continued)

*Primary Examiner* — Allan Olsen
(74) *Attorney, Agent, or Firm* — Wood Herron & Evans LLP

(57) ABSTRACT

A beam processing system and method of operating are described. In particular, the beam processing system includes a beam source having a nozzle assembly that is configured to introduce a primary gas through the nozzle assembly to a vacuum vessel in order to produce a gaseous beam, such as a gas cluster beam, and optionally, an ionizer positioned downstream from the nozzle assembly, and configured to ionize the gaseous beam to produce an ionized gaseous beam. The beam processing system further includes a process chamber within which a substrate is positioned for treatment by the gaseous beam, and a secondary gas source, wherein the secondary gas source includes a secondary gas supply system that delivers a secondary gas, and a secondary gas controller that operatively controls the flow of the secondary gas injected into the beam processing system downstream of the nozzle assembly.

20 Claims, 6 Drawing Sheets

(51) Int. Cl.
  *H01J 37/305* (2006.01)
  *H01L 21/311* (2006.01)
  *H01J 27/02* (2006.01)
  *H01L 21/3213* (2006.01)
  *H01J 37/317* (2006.01)

(52) U.S. Cl.
  CPC .. H01L 21/31116 (2013.01); H01L 21/32136 (2013.01); *H01J 2237/006* (2013.01); *H01J 2237/0812* (2013.01); *H01J 2237/16* (2013.01); *H01J 2237/3174* (2013.01); *H01J 2237/31732* (2013.01)

(56) References Cited

U.S. PATENT DOCUMENTS

| | | | | |
|---|---|---|---|---|
| 8,173,980 | B2* | 5/2012 | Graf | H01J 37/3002 250/423 R |
| 2005/0205802 | A1 | 9/2005 | Swenson et al. | |
| 2008/0142735 | A1* | 6/2008 | Chandler | H01J 37/3056 250/492.1 |
| 2011/0272593 | A1* | 11/2011 | Graf | H01J 37/3002 250/423 R |
| 2011/0272594 | A1 | 11/2011 | Graf et al. | |
| 2012/0045615 | A1* | 2/2012 | Kirkpatrick | H01J 37/05 428/141 |
| 2012/0119113 | A1 | 5/2012 | Colvin et al. | |
| 2012/0247670 | A1 | 10/2012 | Dobashi et al. | |
| 2013/0059446 | A1 | 3/2013 | Tabat et al. | |
| 2013/0075248 | A1 | 3/2013 | Hara et al. | |
| 2013/0082189 | A1 | 4/2013 | Becker et al. | |
| 2013/0196509 | A1 | 8/2013 | Tabat et al. | |
| 2013/0306597 | A1 | 11/2013 | Gunji et al. | |
| 2013/0330924 | A1* | 12/2013 | Olsen | H01L 22/26 438/667 |
| 2014/0123457 | A1 | 5/2014 | Becker et al. | |
| 2014/0206187 | A1 | 7/2014 | Hara et al. | |
| 2014/0363678 | A1* | 12/2014 | Kirkpatrick | C23C 14/5833 428/408 |
| 2015/0056815 | A1* | 2/2015 | Fernandez | H01L 21/31056 438/712 |
| 2015/0144786 | A1* | 5/2015 | Gwinn | H01J 37/30 250/307 |
| 2015/0294838 | A1* | 10/2015 | Kirkpatrick | H01J 37/3171 250/251 |
| 2016/0172197 | A1* | 6/2016 | Kirkpatrick | H01J 37/05 257/77 |

FOREIGN PATENT DOCUMENTS

| | | |
|---|---|---|
| JP | A-2014-212253 | 11/2014 |
| TW | 201201240 A | 1/2012 |
| TW | 201318056 A | 5/2013 |
| TW | 201327666 A | 7/2013 |
| WO | WO 2014/010751 | 1/2014 |

OTHER PUBLICATIONS

International Searching Authority, Search Report and Written Opinion issued in related PCT Application No. PCT/US2016/047943, dated Dec. 15, 2015, 13 pp.

Taiwan Intellectual Property Office, Rejection Decision issued in counterpart Application No. TW104129088 issued Jan. 16, 2017, 15 pp., including English translation.

* cited by examiner

PROCESS GAS ENHANCEMENT FOR BEAM TREATMENT OF A SUBSTRATE

CROSS-REFERENCE TO RELATED APPLICATIONS

Pursuant to 37 C.F.R. §1.78(a)(4), this application claims the benefit of and priority to U.S. Provisional Application No. 62/046,878, filed on Sep. 5, 2014, which is expressly incorporated by reference herein in its entirety.

FIELD OF INVENTION

The invention relates to beam processing, such as gas cluster ion beam (GCIB) processing.

BACKGROUND OF THE INVENTION

Description of Related Art

Gas cluster ion beam (GCIB) technology has been demonstrated as a useful processing technique for modifying, etching, cleaning, smoothing, and forming thin films on workpieces, including microelectronic workpieces. For purposes of this discussion, gas clusters are nano-sized aggregates of material that are gaseous under conditions of standard temperature and pressure. Such gas clusters may be formed by the condensation of individual gas atoms (or molecules) during the expansion of high-pressure gas from a nozzle into a vacuum, and they may consist of aggregates including a few to several thousand atoms/molecules, or more, that are loosely bound together by weak interatomic forces referred to as Van der Waals forces. The gas clusters can be ionized by electron bombardment, which permits the gas clusters to be accelerated using an electric field to form directed beams of controllable beam energy.

Irradiation of a workpiece by a directed GCIB of controllable energy may be used to treat the workpiece according to a dose that is specific to the location on the workpiece. The technique is referred to as location specific processing (LSP), wherein the treatment dose or dwell time of the GCIB is varied across the workpiece by adjusting the scan speed. Therefore, one location on the workpiece may be processed differently than another location.

Several emerging applications for GCIB processing of workpieces on an industrial scale exist for semiconductor/microelectronic device fabrication. At present, with continued dimensional scaling in advanced CMOS (complementary metal oxide semiconductor) logic and memory, the requirements for dimensional variability control and material manipulation are concurrently escalating and becoming more challenging. As a result, the opportunity for insertion of GCIB processing into fab workflows is expanding. However, to make GCIB processing a viable and sustainable technology, implementation must ensure adequate process rate for throughput requirements, material selectivity, and process yield with low particle contamination, among others.

SUMMARY OF THE INVENTION

Embodiments of the invention relate to beam processing, such as GCIB processing. In particular, some embodiments of the invention relate to GCIB etch processing. Furthermore, other embodiments of the invention relate to GCIB processing with reduced particle contamination.

According to one embodiment, beam processing system, such as a gas cluster ion beam (GCIB) processing system, and method of operating are described. In particular, beam processing system and method of operating are described. In particular, the beam processing system includes a beam source having a nozzle assembly that is configured to introduce a primary gas through the nozzle assembly to a vacuum vessel in order to produce a gaseous beam, such as a gas cluster beam, and optionally, an ionizer positioned downstream from the nozzle assembly, and configured to ionize the gaseous beam to produce an ionized gaseous beam. The beam processing system further includes a process chamber within which a substrate is positioned for treatment by the gaseous beam, and a secondary gas source, wherein the secondary gas source includes a secondary gas supply system that delivers a secondary gas, and a secondary gas controller that operatively controls the flow of the secondary gas injected into the beam processing system downstream of the nozzle assembly.

According to another embodiment, a method of treating a substrate is described. The method includes: providing a substrate in a processing chamber of a beam processing system, such as a gas cluster ion beam (GCIB) processing system; forming a gaseous beam, such as a GCIB, by expanding a primary gas through at least one nozzle into the beam processing system; supplying a secondary gas to the beam processing system at a location downstream from an exit of the at least one nozzle; and independent of the supplying, irradiating the gaseous beam onto an exposed surface of the substrate to treat an exposed surface of the substrate in the presence of the secondary gas.

DETAILED DESCRIPTION OF SEVERAL EMBODIMENTS

Figure 1:
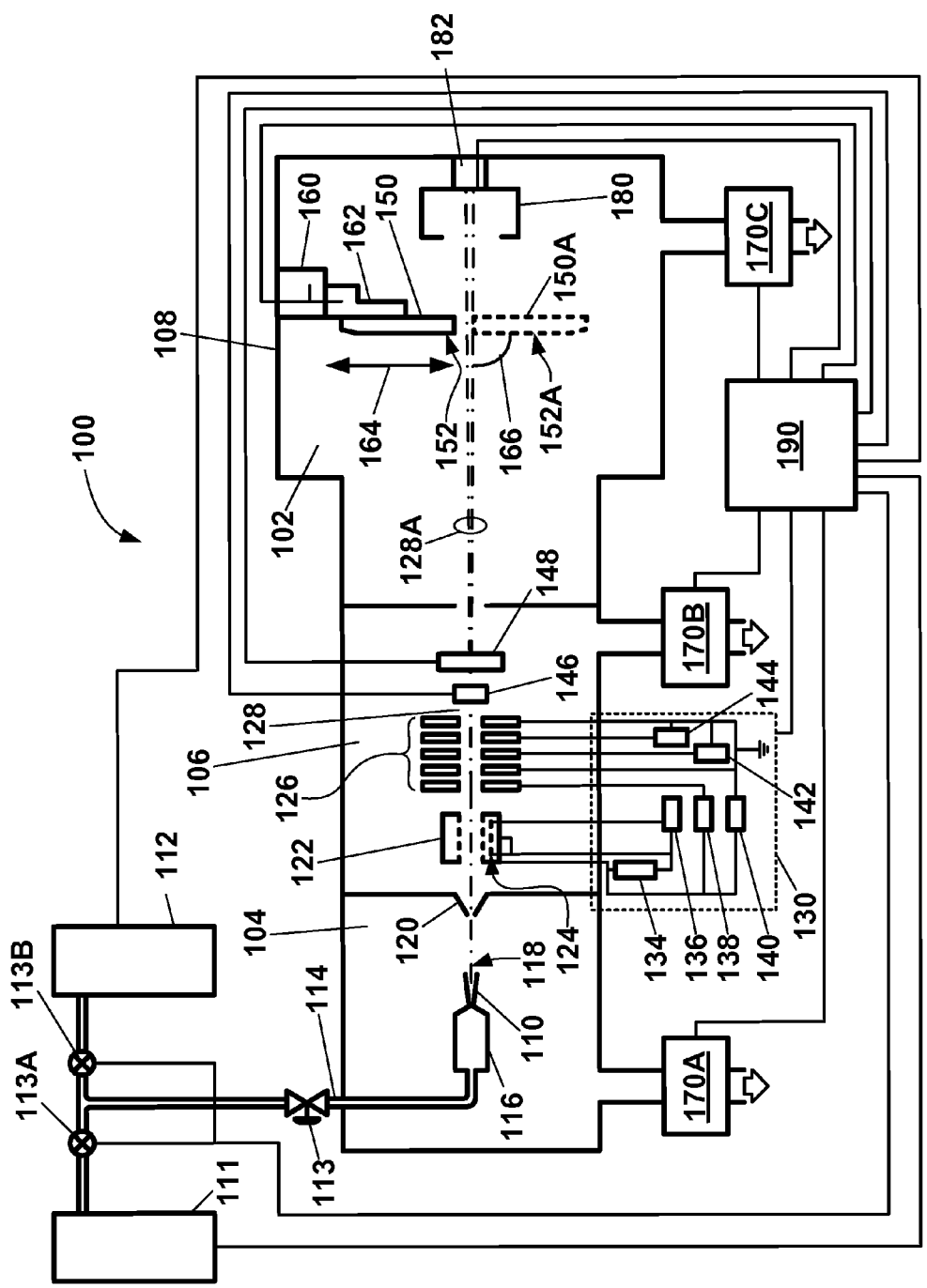
FIG. 1 is an illustration of a GCIB processing system.

Systems and methods for treating layers, including silicon-containing, Ge-containing, metal-containing, and semiconductor layers, on a substrate using beam processing, such as gas cluster ion beam (GCIB) processing, are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

As described in part above, process yield, rate, selectivity, profile control, including CD (critical dimension) control, and surface roughness provide, among other process results, essential metrics for determining successful beam treatment, such as GCIB treatment. To improve beam processing performance and stability, several embodiments are provided herein.

Therefore, according to various embodiments, systems and methods for treating a substrate with a gaseous beam are described. Throughout the specification, the formation, use, and enhancement of a gas cluster ion beam (GCIB) to treat a substrate, such as a semiconductor workpiece or microelectronic device workpiece, is described. However, the description is not to be limited in scope to GCIB processing systems. More generically, various embodiments described below relate to a beam processing system configured to form a gaseous beam. The gaseous beam includes, but is not limited to, a particle beam, a charged particle beam, a gas cluster beam (GCB), a gas cluster ion beam (GCIB), or a combination thereof, or any portion thereof. Any portion of the gaseous beam, charged and/or uncharged, can be used to treat the substrate. The gaseous beam can include ionized species, neutral species, or mixtures thereof. The gaseous beam can include atomic species, molecular species, clustered species, or mixtures thereof. In one example, the gaseous beam can include a GCB that has not been ionized. In another example, the gaseous beam can include a GCIB that has been ionized. In yet another embodiment, an ionized or charged constituent of the GCIB can be separated and directed to treat the substrate, or alternatively, a neutral constituent of the GCIB can be separated and directed to treat the substrate.

Referring now to the drawings wherein like reference numerals designate corresponding parts throughout the several views, FIG. 1 provides a schematic illustration of a GCIB processing system 100 for treating a substrate according to an embodiment. The GCIB processing system 100 comprises a vacuum vessel 102, substrate holder 150, upon which a substrate 152 to be processed is affixed, and vacuum pumping systems 170A, 170B, and 170C. Substrate 152 can be a semiconductor substrate, a wafer, a flat panel display (FPD), a liquid crystal display (LCD), or any other workpiece. GCIB processing system 100 is configured to produce a GCIB for treating substrate 152.

Referring still to GCIB processing system 100 in FIG. 1, the vacuum vessel 102 comprises three communicating chambers, namely, a source chamber 104, an ionization/acceleration chamber 106, and a processing chamber 108 to provide a reduced-pressure enclosure. The three chambers are evacuated to suitable operating pressures by vacuum pumping systems 170A, 170B, and 170C, respectively. In the three communicating chambers 104, 106, 108, a gas cluster beam can be formed in the first chamber (source chamber 104), while a GCIB can be formed in the second chamber (ionization/acceleration chamber 106) wherein the gas cluster beam is ionized and accelerated. Then, in the third chamber (processing chamber 108), the accelerated GCIB may be utilized to treat substrate 152.

As shown in FIG. 1, GCIB processing system 100 can comprise one or more gas sources configured to introduce one or more gases or mixture of gases to vacuum vessel 102. For example, a first gas composition stored in a first gas source 111 is admitted under pressure through a first gas control valve 113A to a gas metering valve or valves 113. Additionally, for example, a second gas composition stored in a second gas source 112 is admitted under pressure through a second gas control valve 113B to the gas metering valve or valves 113. Further, for example, the first gas composition or second gas composition or both can include a condensable inert gas, carrier gas or dilution gas. For example, the inert gas, carrier gas or dilution gas can include a noble gas, i.e., He, Ne, Ar, Kr, Xe, or Rn.

Furthermore, the first gas source 111 and the second gas source 112 may be utilized either alone or in combination with one another to produce ionized clusters. The material composition can include the principal atomic or molecular species of the elements desired to react with or be introduced to the material layer.

The high pressure, condensable gas comprising the first gas composition or the second gas composition or both is introduced through gas feed tube 114 into stagnation chamber 116 and is ejected into the substantially lower pressure vacuum through a properly shaped nozzle 110. As a result of the expansion of the high pressure, condensable gas from the stagnation chamber 116 to the lower pressure region of the source chamber 104, the gas velocity accelerates to supersonic speeds and gas cluster beam 118 emanates from nozzle 110.

The inherent cooling of the jet as static enthalpy is exchanged for kinetic energy, which results from the expansion in the jet, causes a portion of the gas jet to condense and form a gas cluster beam 118 having clusters, each consisting of from several to several thousand weakly bound atoms or molecules. A gas skimmer 120, positioned downstream from the exit of the nozzle 110 between the source chamber 104 and ionization/acceleration chamber 106, partially separates the gas molecules on the peripheral edge of the gas cluster beam 118, that may not have condensed into a cluster, from the gas molecules in the core of the gas cluster beam 118, that may have formed clusters. Among other reasons, this selection of a portion of gas cluster beam 118 can lead to a reduction in the pressure in the downstream regions where higher pressures may be detrimental (e.g., ionizer 122, and processing chamber 108). Furthermore, gas skimmer 120 defines an initial dimension for the gas cluster beam entering the ionization/acceleration chamber 106.

The GCIB processing system 100 may also include multiple nozzles with one or more skimmer openings. Additional details concerning the design of a multiple gas cluster ion beam system are provided in U.S. Patent Application Publication No. 2010/0193701A1, entitled "Multiple Nozzle Gas Cluster Ion Beam System" and filed on Apr. 23, 2009; and U.S. Patent Application Publication No. 2010/0193472A1, entitled "Multiple Nozzle Gas Cluster Ion Beam Processing System and Method of Operating" and filed on Mar. 26, 2010; the contents of which are herein incorporated by reference in their entirety.

After the gas cluster beam 118 has been formed in the source chamber 104, the constituent gas clusters in gas cluster beam 118 are ionized by ionizer 122 to form GCIB 128. The ionizer 122 may include an electron impact ionizer that produces electrons from one or more filaments 124, which are accelerated and directed to collide with the gas clusters in the gas cluster beam 118 inside the ionization/acceleration chamber 106. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 1, beam electronics 130 are utilized to ionize, extract, accelerate, and focus the GCIB 128. The beam electronics 130 include a filament power supply 136 that provides voltage $V_F$ to heat the ionizer filament 124.

Additionally, the beam electronics 130 include a set of suitably biased high voltage electrodes 126 in the ionization/acceleration chamber 106 that extracts the cluster ions from the ionizer 122. The high voltage electrodes 126 then accelerate the extracted cluster ions to a desired energy and focus them to define GCIB 128. The kinetic energy of the cluster ions in GCIB 128 typically ranges from about 1000 electron volts (1 keV) to several tens of keV. For example, GCIB 128 can be accelerated to 1 to 100 keV.

As illustrated in FIG. 1, the beam electronics 130 further include an anode power supply 134 that provides voltage $V_A$ to an anode of ionizer 122 for accelerating electrons emitted from ionizer filament 124 and causing the electrons to bombard the gas clusters in gas cluster beam 118, which produces cluster ions.

Additionally, as illustrated in FIG. 1, the beam electronics 130 include an extraction power supply 138 that provides voltage $V_{EE}$ to bias at least one of the high voltage electrodes 126 to extract ions from the ionizing region of ionizer 122 and to form the GCIB 128. For example, extraction power supply 138 provides a voltage to a first electrode of the high voltage electrodes 126 that is less than or equal to the anode voltage of ionizer 122.

Furthermore, the beam electronics 130 can include an accelerator power supply 140 that provides voltage $V_{ACC}$ to bias one of the high voltage electrodes 126 with respect to the ionizer 122 so as to result in a total GCIB acceleration energy equal to about $V_{ACC}$ electron volts (eV). For example, accelerator power supply 140 provides a voltage to a second electrode of the high voltage electrodes 126 that is less than or equal to the anode voltage of ionizer 122 and the extraction voltage of the first electrode.

Further yet, the beam electronics 130 can include lens power supplies 142, 144 that may be provided to bias some of the high voltage electrodes 126 with potentials (e.g., $V_{L1}$ and $V_{L2}$) to focus the GCIB 128. For example, lens power supply 142 can provide a voltage to a third electrode of the high voltage electrodes 126 that is less than or equal to the anode voltage of ionizer 122, the extraction voltage of the first electrode, and the accelerator voltage of the second electrode, and lens power supply 144 can provide a voltage to a fourth electrode of the high voltage electrodes 126 that is less than or equal to the anode voltage of ionizer 122, the extraction voltage of the first electrode, the accelerator voltage of the second electrode, and the first lens voltage of the third electrode.

Note that many variants on both the ionization and extraction schemes may be used. While the scheme described here is useful for purposes of instruction, another extraction scheme involves placing the ionizer and the first element of the extraction electrode(s) (or extraction optics) at $V_{ACC}$. This typically requires fiber optic programming of control voltages for the ionizer power supply, but creates a simpler overall optics train. The invention described herein is useful regardless of the details of the ionizer and extraction lens biasing.

A beam filter 146 in the ionization/acceleration chamber 106 downstream of the high voltage electrodes 126 can be utilized to eliminate monomers, or monomers and light cluster ions from the GCIB 128 to define a filtered process GCIB 128A that enters the processing chamber 108. In one embodiment, the beam filter 146 substantially reduces the number of clusters having 100 or less atoms or molecules or both. The beam filter may comprise a magnet assembly for imposing a magnetic field across the GCIB 128 to aid in the filtering process.

Referring still to FIG. 1, a beam gate 148 is disposed in the path of GCIB 128 in the ionization/acceleration chamber 106. Beam gate 148 has an open state in which the GCIB 128 is permitted to pass from the ionization/acceleration chamber 106 to the processing chamber 108 to define process GCIB 128A, and a closed state in which the GCIB 128 is blocked from entering the processing chamber 108. A control cable conducts control signals from control system 190 to beam gate 148. The control signals controllably switch beam gate 148 between the open or closed states.

A substrate 152, which may be a wafer or semiconductor wafer, a flat panel display (FPD), a liquid crystal display (LCD), or other substrate to be processed by GCIB processing, is disposed in the path of the process GCIB 128A in the processing chamber 108. Because most applications contemplate the processing of large substrates with spatially uniform results, a scanning system may be desirable to uniformly scan the process GCIB 128A across large areas to produce spatially homogeneous results.

An X-scan actuator 160 provides linear motion of the substrate holder 150 in the direction of X-scan motion (into and out of the plane of the paper). A Y-scan actuator 162 provides linear motion of the substrate holder 150 in the direction of Y-scan motion 164, which is typically orthogonal to the X-scan motion. The combination of X-scanning and Y-scanning motions translates the substrate 152, held by the substrate holder 150, in a raster-like scanning motion through process GCIB 128A to cause a uniform (or otherwise programmed) irradiation of a surface of the substrate 152 by the process GCIB 128A for processing of the substrate 152.

The substrate holder 150 disposes the substrate 152 at an angle with respect to the axis of the process GCIB 128A so that the process GCIB 128A has an angle of beam incidence 166 with respect to a substrate 152 surface. The angle of beam incidence 166 may be 90 degrees or some other angle, but is typically 90 degrees or near 90 degrees. During Y-scanning, the substrate 152 and the substrate holder 150 move from the shown position to the alternate position "A" indicated by the designators 152A and 150A, respectively. Notice that in moving between the two positions, the substrate 152 is scanned through the process GCIB 128A, and in both extreme positions, is moved completely out of the path of the process GCIB 128A (over-scanned). Though not shown explicitly in FIG. 1, similar scanning and over-scan is performed in the (typically) orthogonal X-scan motion direction (in and out of the plane of the paper).

A beam current sensor 180 may be disposed beyond the substrate holder 150 in the path of the process GCIB 128A so as to intercept a sample of the process GCIB 128A when the substrate holder 150 is scanned out of the path of the process GCIB 128A. The beam current sensor 180 is typically a Faraday cup or the like, closed except for a beam-entry opening, and is typically affixed to the wall of the vacuum vessel 102 with an electrically insulating mount 182.

As shown in FIG. 1, control system 190 connects to the X-scan actuator 160 and the Y-scan actuator 162 through electrical cable and controls the X-scan actuator 160 and the Y-scan actuator 162 in order to place the substrate 152 into or out of the process GCIB 128A and to scan the substrate 152 uniformly relative to the process GCIB 128A to achieve desired processing of the substrate 152 by the process GCIB 128A. Control system 190 receives the sampled beam current collected by the beam current sensor 180 by way of an electrical cable and, thereby, monitors the GCIB and controls the GCIB dose received by the substrate 152 by removing the substrate 152 from the process GCIB 128A when a predetermined dose has been delivered.

Figure 2:
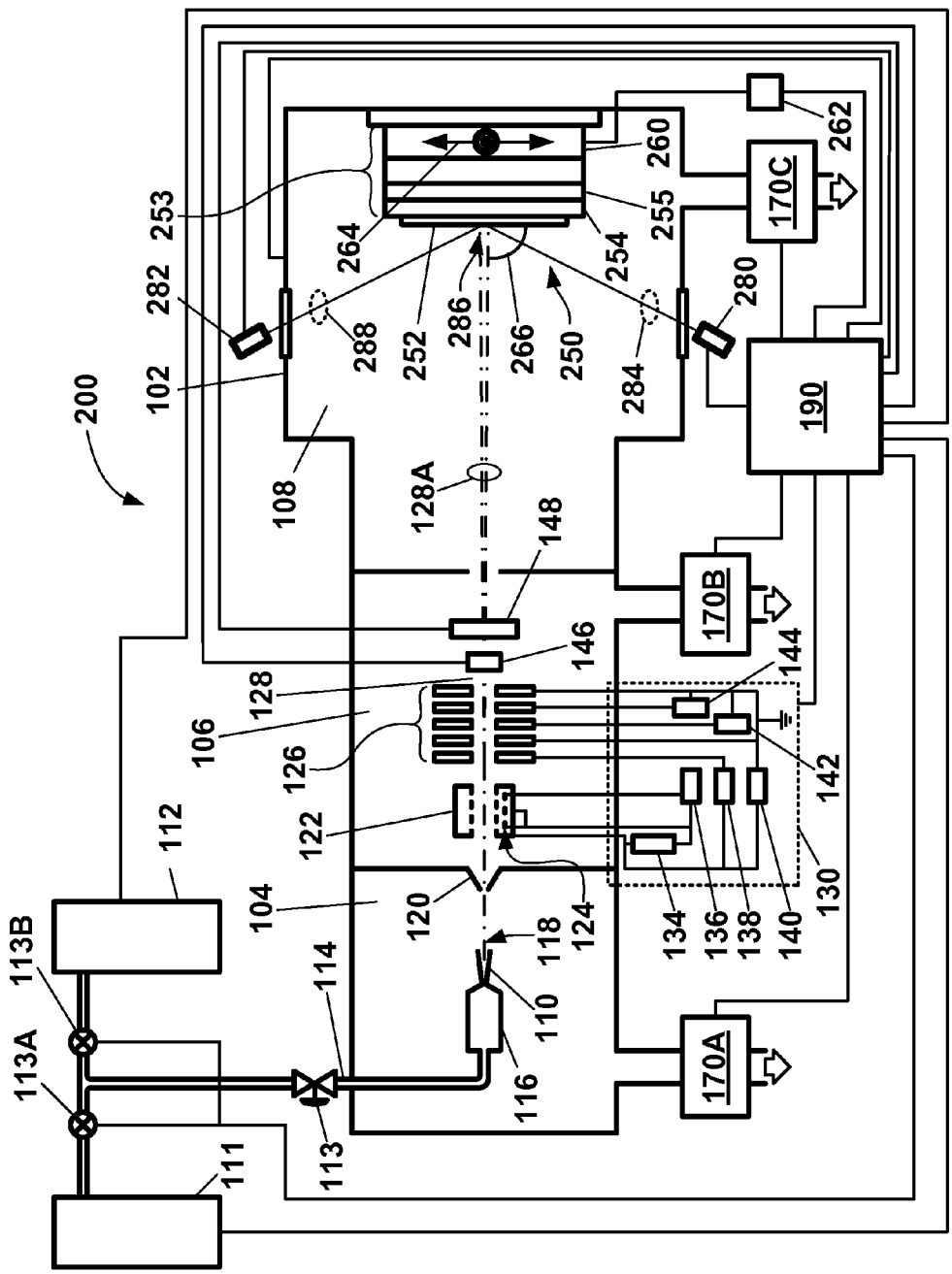
FIG. 2 is another illustration of a GCIB processing system.

In the embodiment shown in FIG. 2, the GCIB processing system 200 can be similar to the embodiment of FIG. 1 and further comprise a X-Y positioning table 253 operable to hold and move a substrate 252 in two axes, effectively scanning the substrate 252 relative to the process GCIB 128A. For example, the X-motion can include motion into and out of the plane of the paper, and the Y-motion can include motion along direction 264.

The process GCIB 128A impacts the substrate 252 at a projected impact region 286 on a surface of the substrate 252, and at an angle of beam incidence 266 with respect to the surface of substrate 252. By X-Y motion, the X-Y positioning table 253 can position each portion of a surface of the substrate 252 in the path of process GCIB 128A so that every region of the surface may be made to coincide with the projected impact region 286 for processing by the process GCIB 128A. An X-Y controller 262 provides electrical signals to the X-Y positioning table 253 through an electrical cable for controlling the position and velocity in each of X-axis and Y-axis directions. The X-Y controller 262 receives control signals from, and is operable by, control system 190 through an electrical cable. X-Y positioning table 253 moves by continuous motion or by stepwise motion according to conventional X-Y table positioning technology to position different regions of the substrate 252 within the projected impact region 286. In one embodiment, X-Y positioning table 253 is programmably operable by the control system 190 to scan, with programmable velocity, any portion of the substrate 252 through the projected impact region 286 for GCIB processing by the process GCIB 128A.

The substrate holding surface 254 of positioning table 253 is electrically conductive and is connected to a dosimetry processor operated by control system 190. An electrically insulating layer 255 of positioning table 253 isolates the substrate 252 and substrate holding surface 254 from the base portion 260 of the positioning table 253. Electrical charge induced in the substrate 252 by the impinging process GCIB 128A is conducted through substrate 252 and substrate holding surface 254, and a signal is coupled through the positioning table 253 to control system 190 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the process GCIB 128A. In such case, a Faraday cup (not shown, but which may be similar to beam current sensor 180 in FIG. 5) may be used to assure accurate dosimetry despite the added source of electrical charge, the reason being that typical Faraday cups allow only the high energy positive ions to enter and be measured.

In operation, the control system 190 signals the opening of the beam gate 148 to irradiate the substrate 252 with the process GCIB 128A. The control system 190 monitors measurements of the GCIB current collected by the substrate 252 in order to compute the accumulated dose received by the substrate 252. When the dose received by the substrate 252 reaches a predetermined dose, the control system 190 closes the beam gate 148 and processing of the substrate 252 is complete. Based upon measurements of the GCIB dose received for a given area of the substrate 252, the control system 190 can adjust the scan velocity in order to achieve an appropriate beam dwell time to treat different regions of the substrate 252.

Alternatively, the process GCIB 128A may be scanned at a constant velocity in a fixed pattern across the surface of the substrate 252; however, the GCIB intensity is modulated (may be referred to as Z-axis modulation) to deliver an intentionally non-uniform dose to the sample. The GCIB intensity may be modulated in the GCIB processing system 100' by any of a variety of methods, including varying the gas flow from a GCIB source supply; modulating the ionizer 122 by either varying a filament voltage $V_F$ or varying an anode voltage $V_A$; modulating the lens focus by varying lens voltages $V_{L1}$ and/or $V_{L2}$; or mechanically blocking a portion of the GCIB with a variable beam block, adjustable shutter, or variable aperture. The modulating variations may be continuous analog variations or may be time modulated switching or gating.

The processing chamber 108 may further include an in-situ metrology system. For example, the in-situ metrology system may include an optical diagnostic system having an optical transmitter 280 and optical receiver 282 configured to illuminate substrate 252 with an incident optical signal 284 and to receive a scattered optical signal 288 from substrate 252, respectively. The optical diagnostic system comprises optical windows to permit the passage of the incident optical signal 284 and the scattered optical signal 288 into and out of the processing chamber 108. Furthermore, the optical transmitter 280 and the optical receiver 282 may comprise transmitting and receiving optics, respectively. The optical transmitter 280 receives, and is responsive to, controlling electrical signals from the control system 190. The optical receiver 282 returns measurement signals to the control system 190.

The in-situ metrology system may comprise any instrument configured to monitor the progress of the GCIB processing. According to one embodiment, the in-situ metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035).

For instance, the in-situ metrology system may include an integrated Optical Digital Profilometry (iODP) scatterometry module configured to measure process performance data resulting from the execution of a treatment process in the GCIB processing system 100'. The metrology system may, for example, measure or monitor metrology data resulting from the treatment process. The metrology data can, for example, be utilized to determine process performance data that characterizes the treatment process, such as a process rate, a relative process rate, a feature profile angle, a critical dimension, a feature thickness or depth, a feature shape, etc. For example, in a process for directionally depositing material on a substrate, process performance data can include a critical dimension (CD), such as a top, middle or bottom CD in a feature (i.e., via, line, etc.), a feature depth, a material thickness, a sidewall angle, a sidewall shape, a deposition rate, a relative deposition rate, a spatial distribution of any parameter thereof, a parameter to characterize the uniformity of any spatial distribution thereof, etc. Operating the X-Y positioning table 253 via control signals from control system 190, the in-situ metrology system can map one or more characteristics of the substrate 252.

Figure 3:
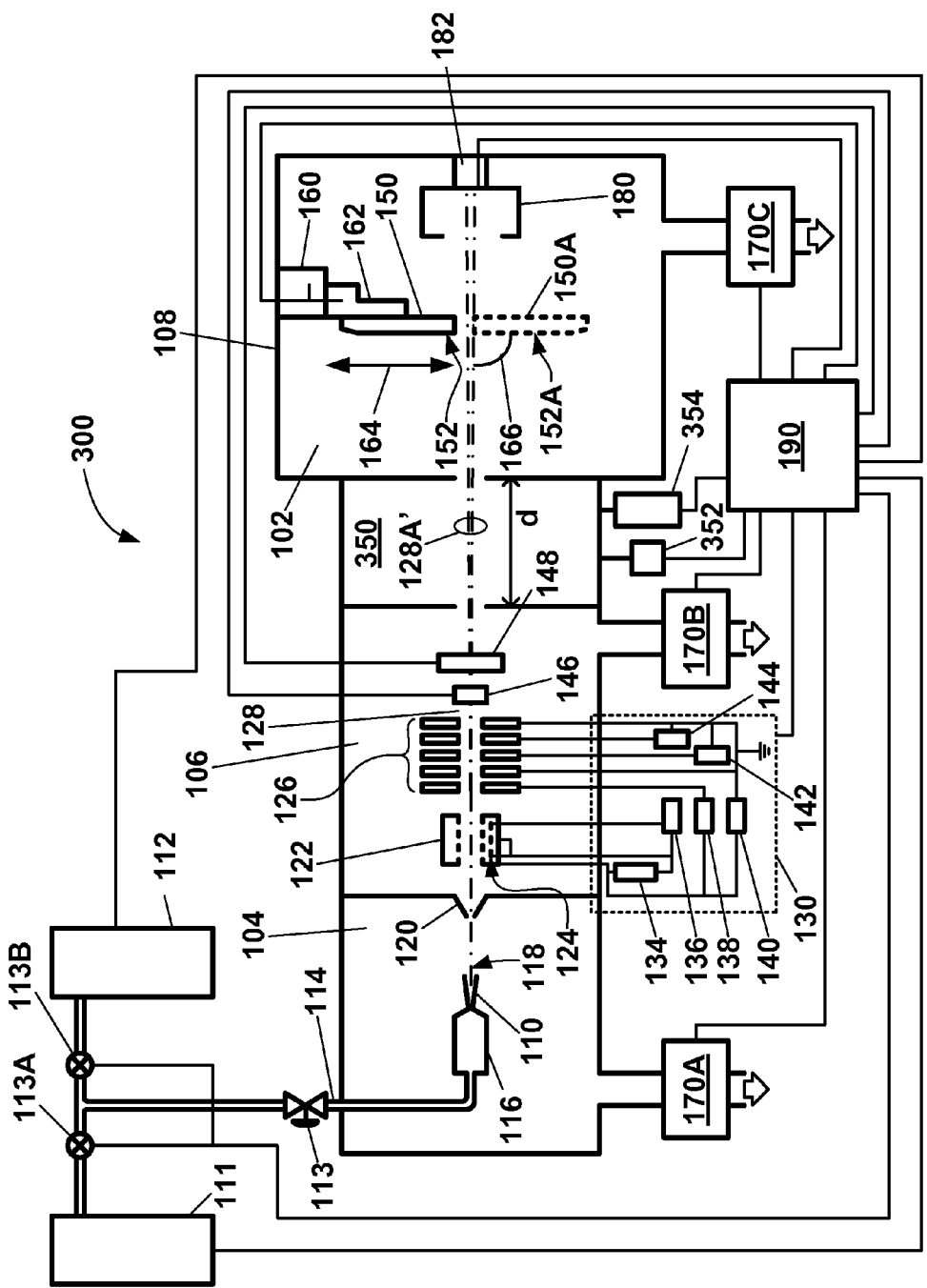
FIG. 3 is yet another illustration of a GCIB processing system.

In the embodiment shown in FIG. 3, the GCIB processing system 300 can be similar to the embodiment of FIG. 1 and further comprise a pressure cell chamber 350 positioned, for example, at or near an outlet region of the ionization/acceleration chamber 106. The pressure cell chamber 350 comprises an inert gas source 352 configured to supply a background gas to the pressure cell chamber 350 for elevating the pressure in the pressure cell chamber 350, and a pressure sensor 354 configured to measure the elevated pressure in the pressure cell chamber 350.

The pressure cell chamber 350 may be configured to modify the beam energy distribution of GCIB 128 to produce a modified processing GCIB 128A'. This modification of the beam energy distribution is achieved by directing GCIB 128 along a GCIB path through an increased pressure region within the pressure cell chamber 350 such that at least a portion of the GCIB traverses the increased pressure region. The extent of modification to the beam energy distribution may be characterized by a pressure-distance integral along the at least a portion of the GCIB path, where distance (or length of the pressure cell chamber 350) is indicated by path length (d). When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. Further details for the design of a pressure cell may be determined from U.S. Pat. No. 7,060,989, entitled "Method and apparatus for improved processing with a gas-cluster ion beam"; the content of which is incorporated herein by reference in its entirety.

Control system 190 comprises a microprocessor, memory, and a digital I/O port capable of generating control voltages sufficient to communicate and activate inputs to GCIB processing system 100 (or 100', 100"), as well as monitor outputs from GCIB processing system 100 (or 100', 100"). Moreover, control system 190 can be coupled to and can exchange information with vacuum pumping systems 170A, 170B, and 170C, first gas source 111, second gas source 112, first gas control valve 113A, second gas control valve 113B, beam electronics 130, beam filter 146, beam gate 148, the X-scan actuator 160, the Y-scan actuator 162, and beam current sensor 180. For example, a program stored in the memory can be utilized to activate the inputs to the aforementioned components of GCIB processing system 100 according to a process recipe in order to perform a GCIB process on substrate 152.

However, the control system 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 190 can be used to configure any number of processing elements, as described above, and the control system 190 can collect, provide, process, store, and display data from processing elements. The control system 190 can include a number of applications, as well as a number of controllers, for controlling one or more of the processing elements. For example, control system 190 can include a graphic user interface (GUI) component (not shown) that can provide interfaces that enable a user to monitor and/or control one or more processing elements.

Control system 190 can be locally located relative to the GCIB processing system 100 (or 100', 100"), or it can be remotely located relative to the GCIB processing system 100 (or 100', 100"). For example, control system 190 can exchange data with GCIB processing system 100 using a direct connection, an intranet, and/or the Internet. Control system 190 can be coupled to an intranet at, for example, a customer site (i.e., a device maker, etc.), or it can be coupled to an intranet at, for example, a vendor site (i.e., an equipment manufacturer). Alternatively or additionally, control system 190 can be coupled to the Internet. Furthermore, another computer (i.e., controller, server, etc.) can access control system 190 to exchange data via a direct connection, an intranet, and/or the Internet.

Substrate 152 (or 252) can be affixed to the substrate holder 150 (or substrate holder 250) via a clamping system (not shown), such as a mechanical clamping system or an electrical clamping system (e.g., an electrostatic clamping system). Furthermore, substrate holder 150 (or 250) can include a heating system (not shown) or a cooling system (not shown) that is configured to adjust and/or control the temperature of substrate holder 150 (or 250) and substrate 152 (or 252).

Vacuum pumping systems 170A, 170B, and 170C can include turbo-molecular vacuum pumps (TMP) capable of pumping speeds up to about 5000 liters per second (and greater) and a gate valve for throttling the chamber pressure. In conventional vacuum processing devices, a 1000 to 3000 liter per second TMP can be employed. TMPs are useful for low pressure processing, typically less than about 50 mTorr. Although not shown, it may be understood that pressure cell chamber 350 may also include a vacuum pumping system. Furthermore, a device for monitoring chamber pressure (not shown) can be coupled to the vacuum vessel 102 or any of the three vacuum chambers 104, 106, 108. The pressuremeasuring device can be, for example, a capacitance manometer or ionization gauge.

Figure 4:
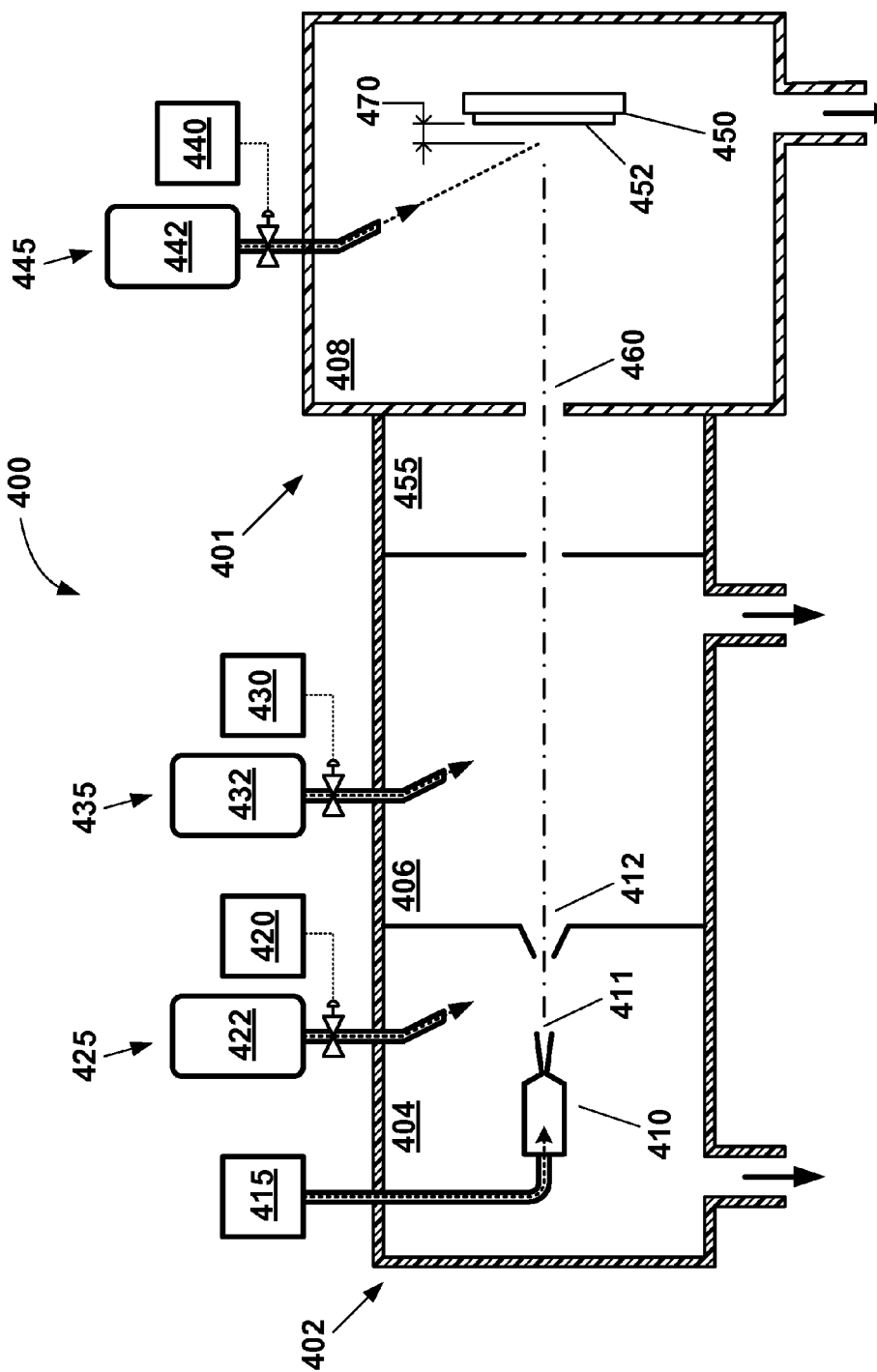
FIG. 4 is another illustration of a portion of a GCIB processing system according to an embodiment.

Referring now to FIG. 4, gas cluster ion beam (GCIB) processing system 400 is described according to another embodiment. GCIB processing system 400 can include any component or combination of componentry depicted in the GCIB processing systems of FIGS. 1 through 3. In particular, GCIB processing system 400 includes a GCIB source 401 having a nozzle assembly 410 that is configured to introduce a primary gas through the nozzle assembly 410 to a vacuum vessel 402 in order to produce a gas cluster beam. An ionizer 412 is positioned downstream from the nozzle assembly 410, and configured to ionize the gas cluster beam to produce a GCIB.

The GCIB processing system 400 further includes a substrate holder 450, upon which a substrate 452 to be processed is affixed and scanned within vacuum vessel 402. Vacuum vessel 402 comprises three communicating chambers, namely, a source chamber 404, an ionization/acceleration chamber 406, and a processing chamber 408 to provide a reduced-pressure enclosure. The three chambers are evacuated to suitable operating pressures by one or more vacuum pumping systems. In the three communicating chambers 404, 406, 408, a gas cluster beam can be formed in the first chamber (source chamber 404), while a GCIB can be formed in the second chamber (ionization/acceleration chamber 406) wherein the gas cluster beam is ionized and accelerated. Then, in the third chamber (processing chamber 408), the accelerated GCIB may be utilized to treat substrate 452. The vacuum vessel 402 may also include a pressure cell chamber 455. The pressure cell chamber 455 is coupled to an inert gas supply system (not shown in FIG. 4) that supplies a background gas to the pressure cell chamber 455 for elevating the pressure in the pressure cell chamber 455.

The GCIB processing system 400 further includes a secondary gas source (425, 435, 445), wherein the secondary gas source (425, 435, 445) includes a secondary gas supply system (422, 432, 442) that delivers a secondary gas, and a secondary gas controller (420, 430, 440) that operatively controls the flow of the secondary gas injected into the GCIB processing system 400 downstream of the nozzle assembly 410. In one embodiment, the secondary gas source 425 is arranged to deliver the secondary gas into the source chamber 404 downstream of the exit 411 of the nozzle assembly 410. In another embodiment, the secondary gas source 435 is arranged to deliver the secondary gas into the ionization/acceleration chamber 406 downstream of a skimmer 412. In another embodiment, the secondary gas source 445 is arranged to deliver the secondary gas into the processing chamber 408 downstream of a final aperture 460. In another embodiment, any combination of the secondary gas source (425, 435, 445) may be used.

In another embodiment, the secondary gas source 445 is arranged to deliver the secondary gas into the processing chamber 408 downstream of the final aperture 460 and along a path that intersects the GCIB at a location spaced away from the exposed surface of substrate 452 by a separation distance 470 (for example, the secondary gas is directed to the processing chamber 408 at or near an impact region of the GCIB with the substrate). Separation distance 470 may be a distance less than 10 mm, less than 5 mm, less than 2 mm, or substantially nil (the secondary gas may be a jet or beam that intersects the GCIB at the exposed surface of the substrate).

The secondary gas controller (420, 430, 440) may be coupled to one or more flow control valves, flow sensors, or pressure sensors. And, the secondary gas controller (420, 430, 440) can control a pressure (e.g., total/stagnation pressure) at which the secondary gas is injected, or a flow rate of the secondary gas, or combination thereof.

Figure 5:
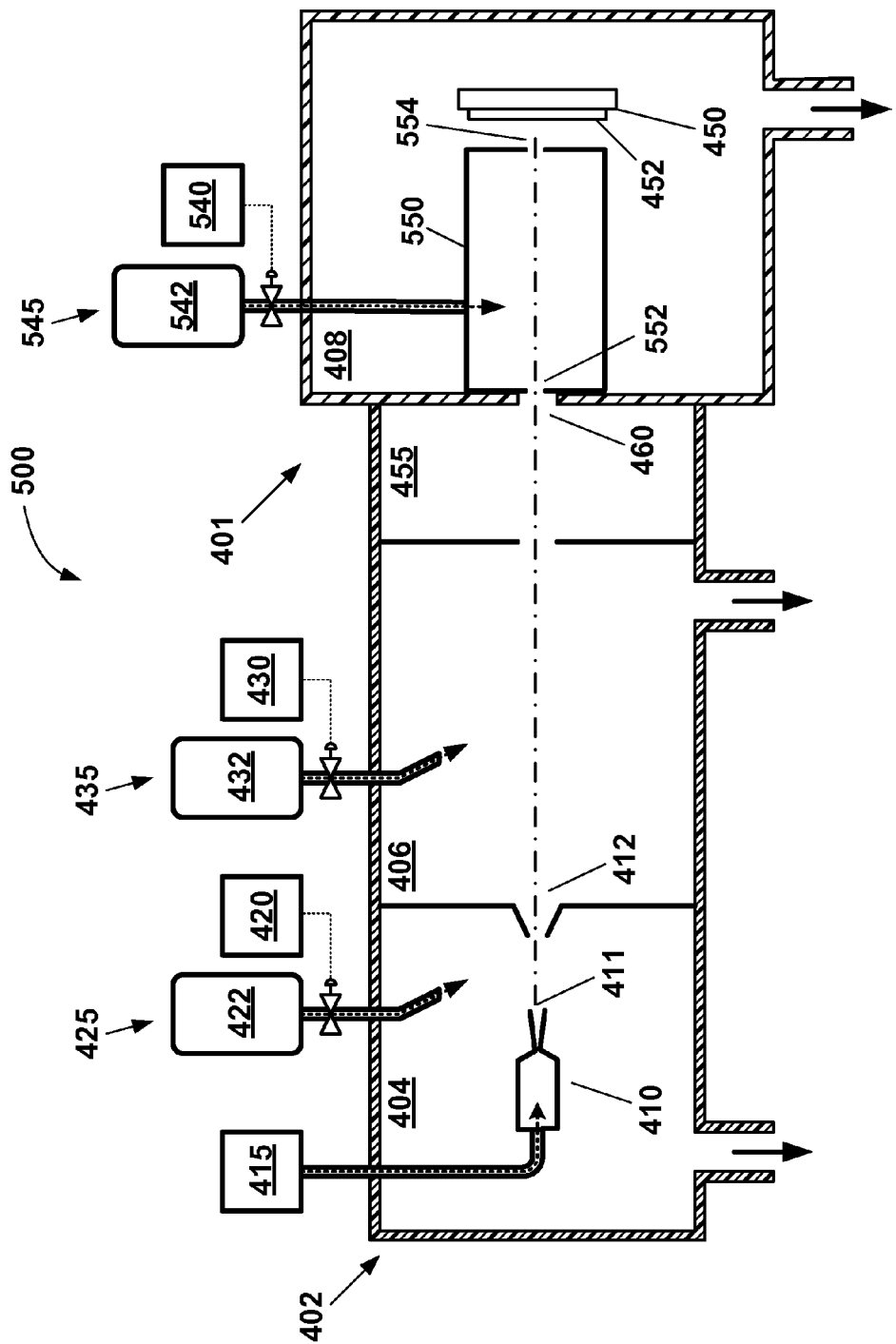
FIG. 5 is yet another illustration of a portion of a GCIB processing system according to an embodiment.

Referring now to FIG. 5, gas cluster ion beam (GCIB) processing system 500 is described according to another embodiment. GCIB processing system 500 can include any component or combination of componentry depicted in the GCIB processing systems of FIGS. 1 through 3. In particular, GCIB processing system 500 further includes a sub-chamber 550 disposed within the processing chamber 408 along the path of the GCIB, wherein the sub-chamber 550 has an inlet 552 through which the GCIB enters sub-chamber 550 and an outlet 554 through which the GCIB exits sub-chamber 550 and immediately thereafter strikes the substrate 452. As shown, the secondary gas source 545 is in fluid communication with sub-chamber 550 and configured to flow the secondary gas directly into sub-chamber 550. Sub-chamber 550 can at least partially contain or confine the interaction of the GCIB with the secondary gas. In another embodiment, sub-chamber 550 can be coupled to a vacuum line and pump (not shown) to allow independent pumping of the sub-chamber interior. In another embodiment, sub-chamber 550 can be coupled to one or more sensors (e.g., pressure sensor, etc.) to permit sampling a property, such as pressure, of the environment within the interior of the sub-chamber 550. In yet other embodiments, sub-chamber 550 can be coupled to multiple gas sources.

GCIB processing system 400 or 500 may be used to etch, grow, deposit, dope, modify, or smooth layers or structures on substrate 452. In one example, GCIB processing system 400 or 500 includes a GCIB etching system, wherein the secondary gas supply system (422, 432, 442, 542) delivers a secondary gas that reacts with the etching GCIB, or the etch byproduct resulting from etching the substrate 452 using the etching GCIB, or both.

Figure 6:
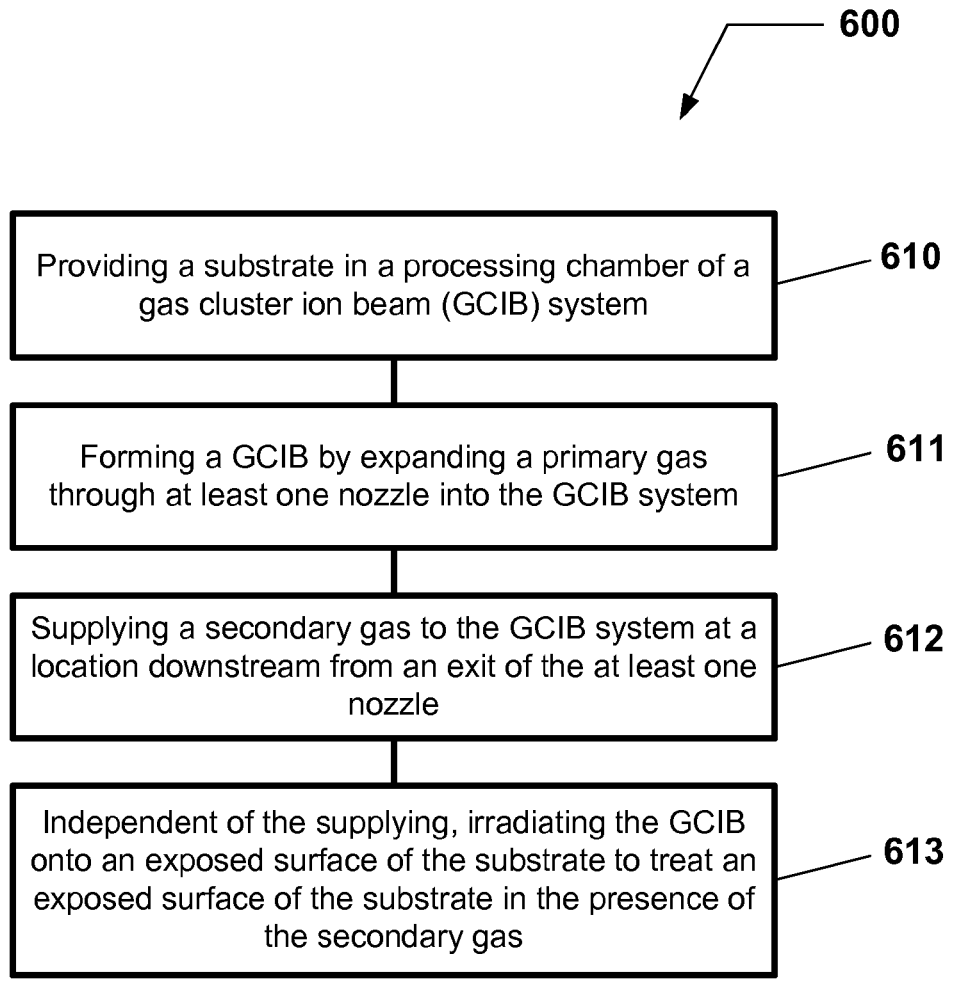
FIG. 6 is a flow chart illustrating a method for treating a substrate according to another embodiment.

As depicted in FIG. 6, a method of operating a GCIB processing system, such as system 100, 200, 300, 400, or 500, is described according to an embodiment. The method illustrated in flow chart 600 begins in 610 with providing a substrate in a processing chamber of a gas cluster ion beam (GCIB) system. The GCIB processing system may include any one of the GCIB processing systems (100, 200, 300, 400, or 500) described below in FIG. 1, 2, 3, 4, or 5, or any combination thereof.

The method proceeds with holding substrate securely within the reduced-pressure environment of the GCIB processing system. The temperature of substrate may or may not be controlled. For example, substrate may be heated or cooled during a GCIB treatment process. Additionally, the substrate may include conductive materials, semi-conductive materials, or dielectric materials, or any combination of two or more thereof. For example, the substrate may include a semiconductor material, such as silicon, silicon-on-insulator (SOI), germanium, or a combination thereof. Additionally, for example, the substrate may include crystalline silicon.

Further, substrate may include may include a Si-containing material and/or a Ge-containing material. The Si-containing material may include Si and at least one element selected from the group consisting of O, N, C, and Ge. The Ge-containing material may include Ge and at least one element selected from the group consisting of O, N, C, and Si.

For example, the substrate may include silicon, doped silicon, un-doped silicon, amorphous silicon, mono-crystalline silicon, poly-crystalline silicon, silicon oxide ($SiO_x$, where x>0; e.g., $SiO_2$), silicon nitride ($SiN_y$, wherein y>0;

e.g., $SiN_{1.33}$, or $Si_3N_4$), silicon carbide ($SiC_z$, wherein z>0), silicon oxynitride ($SiO_xN_y$, where x,y>0), silicon oxycarbide ($SiO_xC_y$, where x,y>0), silicon carbonitride ($SiC_xN_y$, where x,y>0), or silicon-germanium ($Si_xGe_{1-x}$, where x is the atomic fraction of Si, 1−x is the atomic fraction of Ge, and 0<1−x<1). Any one of the materials listed above may be doped or infused with an element selected from the group consisting of B, C, H, N, P, As, Sb, O, S, Se, Te, F, Cl, Br, and I. Further, any one of the materials listed above may be doped or infused with a metal, an alkali metal, an alkaline earth metal, a rare earth metal, a transition metal, or a post-transition metal. Further yet, any one of the materials listed above may be in an amorphous phase or a crystalline phase.

Additionally, the substrate may include a metal-containing material. The metal-containing material may include an alkali metal, an alkaline earth metal, a transition metal, a post-transition metal, a noble metal, or a rare earth metal. The metal-containing material may include a transition or post-transition metal selected from the group consisting of Sc, Y, Zr, Hf, Nb, Ta, V, Cr, Mo, W, Mn, Re, Fe, Ru, Co, Rh, Ni, Pd, Pt, Cu, Ag, Au, Zn, Cd, B, Al, Ga, In, and Sn. The metal-containing material may include a metal, a metal alloy, a metal oxide, a metal nitride, a metal carbide, a metal silicide, a metal germanide, a metal sulfide, etc.

Furthermore, the substrate may also include a semiconductor material. The semiconductor material may include a compound semiconductor, such as a III-V compound (e.g., GaAs, GaN, GaP, InAs, InN, InP, etc.), a II-V compound (e.g., $Cd_3P_2$, etc.), or a II-VI compound (e.g., ZnO, ZnSe, ZnS, etc.) (Groups II, III, V, VI refer to the classical or old IUPAC notation in the Periodic Table of Elements; according to the revised or new IUPAC notation, these Groups would refer to Groups 2, 13, 15, 16, respectively). The substrate may also include a chalcogenide (e.g., sulfides, selenides, tellurides).

Further yet, the substrate may include a photo-resist (e.g., one of the resist materials listed above), a soft mask layer, a hard mask layer, an anti-reflective coating (ARC) layer, an organic planarization layer (OPL), or an organic dielectric layer (ODL), or a combination of two or more thereof.

In 611, a GCIB is formed by expanding a primary gas through at least one nozzle into the GCIB processing system. The primary gas includes a pressurized gas mixture containing at least one atomic specie selected from the group consisting of He, Ne, Ar, Kr, Xe, B, C, H, Si, Ge, N, P, As, O, S, F, Cl, and Br.

As an example, the primary gas can contain at least one etching compound or gas. The at least one etching gas may include a halogen element. The at least one etching gas may include a halogen element and one or more elements selected from the group consisting of C, H, N, and S. The at least one etching gas may include a halogen element and one or more elements selected from the group consisting of Si and Ge.

For example, the at least one etching gas may include $F_2$, $Cl_2$, $Br_2$, $NF_3$, or $SF_6$. Additionally, for example, the at least one etching gas may include a halide, such as HF, HCl, HBr, or HI. Additionally yet, for example, the at least one etching gas may include a halosilane or halogermane, such as a mono-substituted halosilane or halogermane ($SiH_3F$, $GeH_3F$, etc.), di-substituted halosilane or halogermane ($SiH_2F_2$, $GeH_2F_2$, etc.), tri-substituted halosilane or halogermane ($SiHF_3$, $GeHF_3$, etc.), or tetra-substituted halosilane or halogermane ($SiF_4$, $GeF_4$, $SiCl_4$, $GeCl_4$, $SiBr_4$, or $GeBr_4$). Furthermore, for example, the at least one etching gas may include a halomethane, such as a mono-substituted halomethane (e.g., $CH_3F$, $CH_3Cl$, $CH_3Br$, $CH_3I$), a di-substituted halomethane (e.g., $CH_2F_2$, $CH_2ClF$, $CH_2BrF$, $CH_2Fl$, $CH_2Cl_2$, $CH_2BrCl$, $CH_2ClI$, $CH_2Br_2$, $CH_2BrI$, $CH_2I_2$), a tri-substituted halomethane (e.g., $CHF_3$, $CHClF_2$, $CHBrF_2$, $CHF_2I$, $CHCl_2F$, $CHBrClF$, $CHClFI$, $CHBr_2F$, $CHBrFI$, $CHFI_2$, $CHCl_3$, $CHBrCl_2$, $CHCl_2I$, $CHBr_2Cl$, $CHBrClI$, $CHClI_2$, $CHBr_3$, $CHBr_2I$, $CHBrI_2$, $CHI_3$), or a tetra-substituted halomethane (e.g., $CF_4$, $CClF_3$, $CBrF_3$, $CF_3I$, $CCl_2F_2$, $CBrClF_2$, $CClF_2I$, $CBr_2F_2$, $CBrF_2I$, $CF_2I_2$, $CCl_3F$, $CBrCl_2F$, $CCl_2Fl$, $CBr_2ClF$, $CBrClFI$, $CClFI_2$, $CBr_3F$, $CBr_2Fl$, $CBrFI_2$, $CFI_3$, $CCl_4$, $CBrCl_3$, $CCl_3I$, $CBr_2Cl_2$, $CBrCl_2I$, $CCl_2I_2$, $CBr_3Cl$, $CBr_2ClI$, $CBrClI_2$, $CClI_3$, $CBr_4$, $CBr_3I$, $CBr_2I_2$, $CBrI_3$, $CI_4$).

To form the GCIB, constituents of the etching gas should be selected that exist in a gaseous phase either alone or in combination with a carrier gas (e.g., a noble gas element or nitrogen) at relatively high pressure (e.g., a pressure of one atmosphere or greater).

In one embodiment, when etching a Si-containing and/or Ge-containing material, the at least one etching gas includes a halogen element selected from the group consisting of F, Cl, and Br. The at least one etching gas may further include Si, Ge, N, S, C, or H, or both C and H. For example, the at least one etching gas may include a halide, halosilane, halogermane, or a halomethane. Additionally, for example, the at least one etching gas may include $SiF_4$, $CHF_3$, $SF_6$, $NF_3$, $F_2$, $Cl_2$, $Br_2$, HF, HCl, HBr, $CClF_3$, $CBrF_3$, $CHClF_2$, or $C_2ClF_5$, or any combination of two or more thereof.

In another embodiment, when etching a Si-containing and/or Ge-containing material, the at least one etching gas includes two different halogen elements. A first halogen element may be selected from the group consisting of Cl and Br, and the second halogen element may include F. The at least one etching gas may further include C, or H, or both C and H. For example, the at least one etching gas may include a halomethane. Additionally, for example, the at least one etching gas may include $CClF_3$, $CBrF_3$, $CHClF_2$, or $C_2ClF_5$, or any combination of two or more thereof.

In another embodiment, when etching a Si-containing material having Si and one or more elements selected from the group consisting of O, C, N, and Ge, the at least one etching gas includes a halogen element and one or more elements selected from the group consisting of Si, Ge, N, S, C, and H. For example, the etching gas may include a halosilane or halomethane. Additionally, for example, the etching gas may include $SiF_4$, $CH_3F$, $CH_3Cl$, $CH_3Br$, $CHF_3$, $CHClF_2$, $CHBrF_2$, $CH_2F_2$, $CH_2ClF$, $CH_2BrF$, $CHCl_2F$, $CHBr_2F$, $CHCl_3$, $CHBrCl_2$, $CHBr_2Cl$, or $CHBr_3$, or any combination of two or more thereof.

In another embodiment, when etching a metal-containing material, the etching gas includes a halogen element selected from the group consisting of F, Cl, and Br. The etching gas may further include Si, Ge, N, S, C, or H, or both C and H. For example, the etching gas may include a halide, halosilane, halogermane, or a halomethane. Additionally, for example, the etching gas may include $SF_6$, $NF_3$, $F_2$, $Cl_2$, $Br_2$, HF, HCl, HBr, $CClF_3$, $CBrF_3$, $CHClF_2$, or $C_2ClF_5$, or any combination of two or more thereof.

In another embodiment, when etching a metal-containing material, the etching gas includes two different halogen elements. A first halogen element may be selected from the group consisting of Cl and Br, and the second halogen element may include F. The etching gas may further include C, or H, or both C and H. For example, the etching gas may include a halomethane. Additionally, for example, the etching gas may include $CClF_3$, $CBrF_3$, $CHClF_2$, or $C_2ClF_5$, or any combination of two or more thereof.

In yet another embodiment, when etching a chalcogenide material, the etching gas includes a halogen element. For example, the etching gas may include a halide, halosilane, halogermane, or halomethane. Additionally, for example, the etching gas may include $F_2$, $Cl_2$, $Br_2$, HF, HCl, HBr, $NF_3$, $SF_6$, $SiF_4$, $CH_3F$, $CH_3Cl$, $CH_3Br$, $CHF_3$, $CHClF_2$, $CHBrF_2$, $CH_2F_2$, $CH_2ClF$, $CH_2BrF$, $CHCl_2F$, $CHBr_2F$, $CHCl_3$, $CHBrCl_2$, $CHBr_2Cl$, or $CHBr_3$, or any combination of two or more thereof.

The at least one etching gas may include a first etching gas and a second etching gas. In one embodiment, the first etching gas contains Cl or Br, and the second etching gas contains F. For example, the first etching gas may contain $Cl_2$, and the second etching gas may contain $NF_3$. In another embodiment, the first etching gas contains a halomethane or halide, and the second etching gas contains F, Cl, or Br. In another embodiment, the first etching gas contains C, H, and a halogen element, and the second etching gas contains F, Cl, or Br. For example, the first etching gas may contain $CHF_3$, $CHCl_3$, or $CHBr_3$, and the second etching gas may contain $SiF_4$, $SF_6$, $NF_3$ or $Cl_2$. The first etching gas and the second etching gas may be continuously introduced to the GCIB. Alternatively, the first etching gas and the second etching gas may be alternatingly and sequentially introduced to the GCIB.

The pressurized gas mixture may further include a compound containing a halogen element; a compound containing F and C; a compound containing H and C; a compound containing C, H, and F; a compound containing Si and F; a compound containing Ge and F; or any combination of two or more thereof. Additionally, the pressurized gas mixture may further include a chlorine-containing compound, a fluorine-containing compound, or a bromine-containing compound. Additionally, the pressurized gas mixture may further include a compound containing one or more elements selected from the group consisting of S, N, Si, Ge, C, F, H, Cl, and Br. Additionally yet, the pressurized gas mixture may further include a silicon-containing compound, a germanium-containing compound, a nitrogen-containing compound, an oxygen-containing compound, or a carbon-containing compound, or any combination of two or more thereof. Furthermore, the pressurized gas mixture may further include one or more elements selected from the group consisting of B, C, H, Si, Ge, N, P, As, O, S, F, Cl, and Br. Further yet, the pressurized gas mixture may further include He, Ne, Ar, Kr, Xe, $O_2$, CO, $CO_2$, $N_2$, NO, $NO_2$, $N_2O$, $NH_3$, $F_2$, HF, $SF_6$, or $NF_3$, or any combination of two or more thereof.

Even further yet, the GCIB may be generated from a pressurized gas mixture that includes at least one dopant, or film forming constituent for depositing or growing a thin film, or any combination of two or more thereof.

In another embodiment, the GCIB may be generated by alternatingly and sequentially using a first pressurized gas mixture containing an etch gas and a second pressurized gas mixture containing a film forming gas. In yet other embodiments, a composition and/or a stagnation pressure of the GCIB may be adjusted during the etching.

In other embodiments, one or more GCIB properties of a GCIB process condition for the GCIB are set to achieve the one or more target process metrics, such as target etch process metrics. To achieve the target etch process metrics noted above, such as etch rate, etch selectivity, surface roughness control, profile control, etc., the GCIB may be generated by performing the following: selecting a beam acceleration potential, one or more beam focus potentials, and a beam dose; accelerating the GCIB according to the beam acceleration potential; focusing the GCIB to according to the one or more beam focus potentials; and irradiating the accelerated GCIB onto at least a portion of the substrate according to the beam dose.

Furthermore, in addition to these GCIB properties, a beam energy, a beam energy distribution, a beam angular distribution, a beam divergence angle, a stagnation pressure, a stagnation temperature, a mass flow rate, a cluster size, a cluster size distribution, a beam size, a beam composition, a beam electrode potential, or a gas nozzle design (such as nozzle throat diameter, nozzle length, and/or nozzle divergent section half-angle) may be selected. Any one or more of the aforementioned GCIB properties can be selected to achieve control of target etch process metrics, such as those noted above. Furthermore, any one or more of the aforementioned GCIB properties can be modified to achieve control of target etch process metrics, such as those noted above.

As described above in reference to FIG. 3, the beam energy distribution function for the GCIB may be modified by directing the respective GCIB along a GCIB path through an increased pressure region such that at least a portion of the GCIB traverses the increased pressure region. The extent of modification to the beam energy distribution may be characterized by a pressure-distance (d) integral along the at least a portion of the GCIB path. When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. As an example, one may broaden the beam energy distribution to increase the beam divergence, or one may narrow the beam energy distribution to decrease the beam divergence.

The pressure-distance integral along the at least a portion of the GCIB path may be equal to or greater than about 0.0001 torr-cm. Alternatively, the pressure-distance integral along the at least a portion of the GCIB path may be equal to or greater than about 0.001 torr-cm. Alternatively yet, the pressure-distance integral along the at least a portion of the GCIB path may be equal to or greater than about 0.01 torr-cm. As an example, the pressure-distance integral along the at least a portion of the GCIB path may range from 0.0001 torr-cm to 0.01 torr-cm. As another example, the pressure-distance integral along the at least a portion of the GCIB path may range from 0.001 torr-cm to 0.01 torr-cm.

Alternatively, the beam energy distribution function for the GCIB may be modified by modifying or altering a charge state of the respective GCIB. For example, the charge state may be modified by adjusting an electron flux, an electron energy, or an electron energy distribution for electrons utilized in electron collision-induced ionization of gas clusters.

In another embodiment, the directionality of the GCIB relative to normal incidence on the substrate may be adjusted by altering the beam angular distribution function. The beam angular distribution function or beam divergence angle may be modified using the aforementioned techniques described for modifying the beam energy distribution function.

In one embodiment, the one or more GCIB properties of the GCIB process condition may include a GCIB composition, a beam dose, a beam acceleration potential, a beam focus potential, a beam energy, a beam energy distribution, a beam angular distribution, a beam divergence angle, a flow rate of said GCIB composition, a stagnation pressure, a stagnation temperature, a background gas pressure for an increased pressure region through which said GCIB passes, or a background gas flow rate for an increased pressure region through which said GCIB passes (e.g., a P-Cell value, as will be discussed in greater detail below).

In another embodiment, the setting of the one or more GCIB properties to achieve the one or more target etch process metrics may include setting a GCIB composition, a beam acceleration potential, a flow rate of the GCIB composition, and a background gas flow rate for an increased pressure region through which the GCIB passes to achieve two or more of a target etch rate for the two or more materials present on the substrate, a target etch selectivity between the first material and the second material, and a target surface roughness for the first material and/or the second material.

In 612, a secondary gas is supplied to the GCIB processing system at a location downstream from an exit of the at least one nozzle. The location of secondary gas supply can be any one of the arrangements, or combinations thereof, depicted in FIG. 4 or 5. The secondary gas may be selected to enhance the GCIB treatment process, including but not limited to altering a process rate (e.g., etch rate, deposition rate, growth rate, modification rate, etc.), alter a process selectivity (e.g., etch selectivity, etc.), alter a surface condition or property of the substrate (e.g., surface roughness, haze, surface functionality, etc.), alter a contamination level on the substrate or within the GCIB processing system (e.g., particle contamination (chamber particle, substrate surface particle, substrate embedded particle), process residue, deposits, or byproduct, etc.), etc.

The supplying of the secondary gas may be performed before, during, or after the forming of the GCIB. For example, the supplying of secondary gas to the GCIB processing system, including the processing chamber, can be periodic, or continuous before, during and after the forming of the GCIB.

The secondary gas can include at least one atomic specie selected from the group consisting of He, Ne, Ar, Kr, Xe, B, C, H, Si, Ge, N, P, As, O, S, F, Cl, and Br. As an example, the secondary gas can include a hydrogen-containing gas or vapor, or a halogen-containing gas or vapor, or combination thereof.

According to one example, the secondary gas includes a hydrogen-containing gas or vapor, wherein the hydrogen-containing gas or vapor is selected from the group consisting of atomic hydrogen (H), metastable hydrogen (H*), ionic hydrogen (H$^+$), diatomic hydrogen (H$_2$), H-containing radical, H$_2$O, NH$_3$, a hydrocarbon, a halide, a halomethane, or a halosilane, or any combination of two or more thereof. The hydrogen-containing gas or vapor of the forms listed above may be created before injection into the processing chamber or after injection into the processing chamber. For example, a radical generator or plasma generator may be used to create the hydrogen-containing gas or vapor.

The secondary may further include a halogen-containing gas or vapor. For example, the halogen-containing gas or vapor may include an atomic halogen (e.g., F), a metastable halogen (e.g., F*), an ionic halogen (e.g., F$^-$), a diatomic halogen (e.g., F$_2$), a halogen-containing radical, a halide, a halomethane, or a halosilane, or any combination of two or more thereof. Additionally, for example, the halogen-containing gas or vapor may include F$_2$, HF, CHF$_3$, CF$_4$, NF$_3$, or SiF$_4$.

According to another example, when the GCIB is an etching GCIB configured to perform an etching process and etch at least a portion of the exposed surface on the substrate, the primary gas includes an etching compound and the secondary gas includes a halogen-containing gas or vapor, or a hydrogen-containing gas or vapor, or a combination thereof. The secondary gas may be selected to react with a byproduct of the etching process, or enhance the etch process. Therein, the secondary gas may be introduced into the processing chamber proximate the substrate. Additionally, the secondary gas or vapor may be used to increase etch rate, clean or remove etch byproduct or other residue from the substrate surface or chamber component surface, reduce particle formation within the processing chamber or other chamber of the GCIB processing system, or on the substrate surface, before, during or after the etching process.

In 613, independent of the supplying, the GCIB is irradiated onto an exposed surface of the substrate to treat an exposed surface of the substrate in the presence of the secondary gas. The irradiating of the substrate with the GCIB may take place during the supplying of the secondary gas, before the supplying of the secondary gas, or following the supplying of the secondary gas, or any combination of two or more thereof.

During irradiation, the GCIB is accelerated through the reduced pressure environment towards substrate according to a beam acceleration potential. For the GCIB, the beam acceleration potential may range up to 100 kV, the beam energy may range up to 100 keV, the cluster size may range up to several tens of thousands of atoms, and the beam dose may range up to about $1 \times 10^{17}$ clusters per cm$^2$. For example, the beam acceleration potential of the GCIB may range from about 1 kV to about 70 kV (i.e., the beam energy may range from about 1 keV to about 70 keV, assuming an average cluster charge state of unity). Additionally, for example, the beam dose of the GCIB may range from about $1 \times 10^{12}$ clusters per cm$^2$ to about $1 \times 10^{14}$ clusters per cm$^2$.

The GCIB may be established having an energy per atom ratio ranging from about 0.25 eV per atom to about 100 eV per atom. Alternatively, the GCIB may be established having an energy per atom ratio ranging from about 0.25 eV per atom to about 10 eV per atom. Alternatively, the GCIB may be established having an energy per atom ratio ranging from about 1 eV per atom to about 10 eV per atom.

The establishment of the GCIB having a desired energy per atom ratio may include selection of a beam acceleration potential, a stagnation pressure for formation of the GCIB, or a gas flow rate, or any combination thereof. The beam acceleration potential may be used to increase or decrease the beam energy or energy per ion cluster. For example, an increase in the beam acceleration potential causes an increase in the maximum beam energy and, consequently, an increase in the energy per atom ratio for a given cluster size. Additionally, the stagnation pressure may be used to increase or decrease the cluster size for a given cluster. For example, an increase in the stagnation pressure during formation of the GCIB causes an increase in the cluster size (i.e., number of atoms per cluster) and, consequently, a decrease in the energy per atom ratio for a given beam acceleration potential.

Herein, beam dose is given the units of number of clusters per unit area. However, beam dose may also include beam current and/or time (e.g., GCIB dwell time). For example, the beam current may be measured and maintained constant, while time is varied to change the beam dose. Alternatively, for example, the rate at which clusters strike the surface of the substrate per unit area (i.e., number of clusters per unit area per unit time) may be held constant while the time is varied to change the beam dose.

In other embodiments, the method described in FIG. 6 may further include altering the one or more target process metrics to create one or more new target process metrics, and setting one or more additional GCIB properties of an additional GCIB process condition for the GCIB to achieve the one or more new target process metrics.

According to one embodiment, in addition to irradiation of substrate with the GCIB, another GCIB may be used for additional control and/or function. Irradiation of the substrate by another GCIB, such as a second GCIB, may proceed before, during, or after use of the GCIB. For example, another GCIB may be used to dope a portion of the substrate with an impurity. Additionally, for example, another GCIB may be used to modify a portion of the substrate to alter properties of substrate. Additionally, for example, another GCIB may be used to etch a portion of the substrate to remove additional material from substrate. Additionally, for example, another GCIB may be used to clean a portion of the substrate to remove additional material or residue, such as halogen-containing residue, from substrate. Additionally yet, for example, another GCIB may be used to grow or deposit material on a portion of the substrate. The doping, modifying, etching, cleaning, growing, or depositing may comprise introducing one or more elements selected from the group consisting of He, Ne, Ar, Xe, Kr, B, C, Se, Te, Si, Ge, N, P, As, O, S, F, Cl, and Br.

According to another embodiment, the at least one portion of substrate subjected to GCIB irradiation may be cleaned before or after the irradiating with the GCIB. For example, the cleaning process may include a dry cleaning process and/or a wet cleaning process. Additionally, the at least one portion of substrate subjected to GCIB irradiation may be annealed after the irradiating with the GCIB.

According to yet another embodiment, when preparing and/or treating a substrate by GCIB processing, any portion of substrate may be subjected to corrective processing. During corrective processing, metrology data may be acquired using a metrology system coupled to a GCIB processing system, either in-situ or ex-situ. The metrology system may comprise any variety of substrate diagnostic systems including, but not limited to, optical diagnostic systems, X-ray fluorescence spectroscopy systems, four-point probing systems, transmission-electron microscope (TEM), atomic force microscope (AFM), scanning-electron microscope (SEM), etc. Additionally, the metrology system may comprise an optical digital profilometer (ODP), a scatterometer, an ellipsometer, a reflectometer, an interferometer, or any combination of two or more thereof.

For example, the metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035). Additionally, for example, the in-situ metrology system may include an integrated Optical Digital Profilometry (iODP) scatterometry module configured to measure metrology data on a substrate.

The metrology data may include parametric data, such as geometrical, mechanical, electrical and/or optical parameters associated with the substrate, any layer or sub-layer formed on the substrate, and/or any portion of a device on the substrate. For example, metrology data can include any parameter measurable by the metrology systems described above. Additionally, for example, metrology data can include a film thickness, a surface and/or interfacial roughness, a surface contamination, a feature depth, a trench depth, a via depth, a feature width, a trench width, a via width, a critical dimension (CD), an electrical resistance, or any combination of two or more thereof.

The metrology data may be measured at two or more locations on the substrate. Moreover, this data may be acquired and collected for one or more substrates. The one or more substrates may, for instance, include a cassette of substrates. The metrology data is measured at two or more locations on at least one of the one or more substrates and may, for example, be acquired at a plurality of locations on each of the one or more substrates. Thereafter, the plurality of locations on each of the plurality of substrates can be expanded from measured sites to unmeasured sites using a data fitting algorithm. For example, the data fitting algorithm can include interpolation (linear or nonlinear) or extrapolation (linear or nonlinear) or a combination thereof.

Once metrology data is collected for the one or more substrates using the metrology system, the metrology data is provided to a controller for computing correction data. Metrology data may be communicated between the metrology system and the controller via a physical connection (e.g., a cable), or a wireless connection, or a combination thereof. Additionally, the metrology data may be communicated via an intranet or Internet connection. Alternatively, metrology data may be communicated between the metrology system and the controller via a computer readable medium.

Correction data may be computed for location specific processing of the substrate. The correction data for a given substrate comprises a process condition for modulation of the GCIB dose as a function of position on the substrate in order to achieve a change between the parametric data associated with the incoming metrology data and the target parametric data for the given substrate. For example, the correction data for a given substrate can comprise determining a process condition for using the GCIB to correct a non-uniformity of the parametric data for the given substrate. Alternatively, for example, the correction data for a given substrate can comprise determining a process condition for using the GCIB to create a specifically intended non-uniformity of the parametric data for the given substrate.

Using an established relationship between the desired change in parametric data and the GCIB dose and an established relationship between the GCIB dose and a GCIB process condition having a set of GCIB processing parameters, the controller determines correction data for each substrate. For example, a mathematical algorithm can be employed to take the parametric data associated with the incoming metrology data, compute a difference between the incoming parametric data and the target parametric data, invert the GCIB processing pattern (i.e., etching pattern or deposition pattern or both) to fit this difference, and create a beam dose contour to achieve the GCIB processing pattern using the relationship between the change in parametric data and the GCIB dose. Thereafter, for example, GCIB processing parameters can be determined to affect the calculated beam dose contour using the relationship between the beam dose and the GCIB process condition. The GCIB processing parameters can include a beam dose, a beam area, a beam profile, a beam intensity, a beam scanning rate, or an exposure time (or beam dwell time), or any combination of two or more thereof.

Many different approaches to the selection of mathematical algorithm may be successfully employed in this embodiment. In another embodiment, the beam dose contour may selectively deposit additional material in order to achieve the desired change in parametric data.

The correction data may be applied to the substrate using a GCIB. During corrective processing, the GCIB may be configured to perform at least one of smoothing, amorphizing, modifying, doping, etching, growing, or depositing, or any combination of two or more thereof. The application of the corrective data to the substrate may facilitate correction of substrate defects, correction of substrate surface planarity, correction of layer thickness, or improvement of layer adhesion. Once processed to GCIB specifications, the uniformity of the substrate(s) or distribution of the parametric data for the substrate(s) may be examined either in-situ or ex-situ, and the process may be finished or refined as appropriate.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:
1. A method of treating a substrate, comprising:
providing a substrate in a processing chamber of a beam processing system;
forming a gaseous beam by expanding a primary gas through at least one nozzle into the beam processing system;
supplying a secondary gas to the beam processing system at a location downstream from an exit of the at least one nozzle; and
independent of the supplying, irradiating the gaseous beam onto an exposed surface of the substrate to treat the exposed surface of the substrate in the presence of the secondary gas,
wherein the secondary gas comprises a hydrogen-containing gas or vapor, the hydrogen-containing gas or vapor being selected from the group consisting of atomic hydrogen (H), metastable hydrogen (H*), ionic hydrogen (H$^+$), diatomic hydrogen (H$_2$), a hydrogen-containing halomethane, or a hydrogen-containing halosilane, or any combination of two or more thereof.

2. The method of claim 1, wherein the secondary gas further comprises a halogen-containing gas or vapor.

3. The method of claim 2, wherein the halogen-containing gas or vapor includes an atomic halogen, a metastable halogen, an ionic halogen, a diatomic halogen, a halogen-containing radical, a halide, a halomethane, or a halosilane, or any combination of two or more thereof.

4. The method of claim 2, wherein the halogen-containing gas includes F$_2$, HF, CHF$_3$, CF$_4$, NF$_3$, or SiF$_4$, or any combination of two or more thereof.

5. The method of claim 1, wherein the gaseous beam includes a particle beam, a charged particle beam, a gas cluster beam (GCB), a gas cluster ion beam (GCIB), or a combination thereof, or any portion thereof.

6. The method of claim 5, wherein the GCIB comprises an etching GCIB configured to perform an etching process and etch at least a portion of the exposed surface on the substrate, and wherein the secondary gas is selected to react with a byproduct, deposit, or residue of the etching process.

7. The method of claim 1, wherein the irradiating of the substrate with the gaseous beam takes place during the supplying of the secondary gas, or following the supplying of the secondary gas, or a combination thereof.

8. The method of claim 1, wherein the gaseous beam further includes one or more noble elements.

9. The method of claim 1, wherein the irradiating comprises:
establishing the gaseous beam with a process composition including the primary gas;
ionizing at least a portion of the gaseous beam;
selecting a beam energy, a beam energy distribution, a beam focus, and a beam dose to achieve a desired treatment of the exposed surface on the substrate;
accelerating the ionized gaseous beam to achieve the beam energy;
focusing the ionized gaseous beam to achieve the beam focus; and
irradiating at least a portion of the accelerated gaseous beam onto at least part of the substrate according to the beam dose.

10. The method of claim 9, wherein the gaseous beam comprises an energy per atom ratio ranging from about 0.25 eV per atom to about 100 eV per atom.

11. A method of etching a substrate, comprising:
providing a substrate in a processing chamber of a beam processing system;
forming a gaseous beam by expanding a primary gas through at least one nozzle into the beam processing system;
supplying a secondary gas mixture to the beam processing system at a location downstream from an exit of the at least one nozzle; and
independent of the supplying, irradiating at least a portion of the gaseous beam onto an exposed surface of the substrate to treat at least a portion of the substrate in the presence of the secondary gas mixture,
wherein the secondary gas mixture comprises a first gas and a second gas different than the first gas, where the first gas is a halogen-containing gas or vapor, and the second gas is a hydrogen-containing gas or vapor.

12. The method of claim 11, wherein the portion of the substrate includes one of a Si-containing material, a Ge-containing material, or a metal-containing material, or any combination of two or more thereof.

13. The method of claim 12, wherein the Si-containing material includes Si and at least one element selected from the group consisting of O, N, C, B, P, and Ge.

14. The method of claim 11, wherein the primary gas includes an etching compound that is a halogen, a halide, a halomethane, a halosilane, or a halogermane, or any combination of two or more thereof.

15. The method of claim 14, wherein the etching compound includes SiF$_4$, CF$_4$, SF$_6$, CHF$_3$, or NF$_3$, or any combination of two or more thereof.

16. The method of claim 11, further comprising:
providing a sub-chamber within the processing chamber along the path of the gaseous beam, the sub-chamber having an inlet through which the gaseous beam enters the sub-chamber and an outlet through which the gaseous beam exits the sub-chamber and immediately thereafter strikes the substrate; and
flowing the secondary gas directly into the sub-chamber to interact with the gaseous beam.

17. A method of etching a substrate, comprising:
providing a substrate in a processing chamber of a beam processing system;
forming a gaseous beam by expanding a primary gas through at least one nozzle into the beam processing system, the primary gas including a halogen-containing etching gas for etching at least a portion of the substrate;

supplying a secondary gas comprising a halogen-containing gas or vapor and a hydrogen-containing gas or vapor to the beam processing system at a location downstream from an exit of the at least one nozzle; and independent of the supplying, irradiating at least a portion of the gaseous beam onto an exposed surface of the substrate to etch-at least a portion of the substrate in the presence of the secondary gas.

18. The method of claim 17, wherein the portion of the substrate includes one of a Si-containing material, a Ge-containing material, or a metal-containing material, or any combination of two or more thereof.

19. The method of claim 18, wherein the Si-containing material includes Si and at least one element selected from the group consisting of O, N, C, B, P, and Ge.

20. The method of claim 17, wherein the halogen-containing etching gas includes an etching compound with two different halogen elements, or wherein the halogen-containing etching gas includes a first etching gas containing a first halogen and a second etching gas containing a second halogen different that the first halogen.

* * * * *

UNITED STATES PATENT AND TRADEMARK OFFICE
CERTIFICATE OF CORRECTION

PATENT NO. : 9,735,019 B2
APPLICATION NO. : 14/842416
DATED : August 15, 2017
INVENTOR(S) : Michael Graf et al.

It is certified that error appears in the above-identified patent and that said Letters Patent is hereby corrected as shown below:

In the Specification

In Column 3, Line 7, "but do not denote" should read --but does not denote--.

In Column 3, Line 43, "device workpiece, is described." should read --device workpiece, are described--.

In Column 7, Line 8, "is performed in the" should read --are performed in the--.

In Column 12, Line 57, "Further, substrate may include may include a" should read --Further, substrate may include a--.

In Column 16, Line 1, "focusing the GCIB to according" should read --focusing the GCIB according--.

In Column 17, Line 57, "The secondary may further" should read --The secondary gas may further--.

In Column 20, Line 58, "parameters can be determined to affect" should read --parameters can be determined to effect--.

In the Claims

In Column 23, Line 10, Claim 17, "substrate to etch-at least" should read --substrate to etch at least--.

In Column 23, Line 24, Claim 20, "halogen different that the first halogen." should read --halogen different than the first halogen.--.

Signed and Sealed this
Twenty-fourth Day of April, 2018

Andrei Iancu
*Director of the United States Patent and Trademark Office*